United States Patent
Kleijnen et al.

(10) Patent No.: US 11,121,122 B2
(45) Date of Patent: Sep. 14, 2021

(54) FLEXIBLE LIGHT-EMITTING DIODE LIGHTING STRIP WITH INTERPOSER

(71) Applicant: Lumileds LLC, San Jose, CA (US)

(72) Inventors: Christian Kleijnen, Ell (NL); Frank Gubbels, Aachen (DE); Barbara Roswitha Mülders, Aachen (DE); Georg Henninger, Aachen (DE); Florent Monestier, Kerkrade (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/515,810

(22) Filed: Jul. 18, 2019

(65) Prior Publication Data

US 2020/0027863 A1 Jan. 23, 2020

(30) Foreign Application Priority Data

Jul. 18, 2018 (EP) .................................. 18184123

(51) Int. Cl.
*H01L 25/13* (2006.01)
*H01L 33/62* (2010.01)

(52) U.S. Cl.
CPC .............. *H01L 25/13* (2013.01); *H01L 33/62* (2013.01)

(58) Field of Classification Search
CPC ................................ H01L 25/13; H01L 33/62
See application file for complete search history.

(56) References Cited

U.S. PATENT DOCUMENTS

2009/0154156 A1 6/2009 Lo et al.
2009/0296382 A1 12/2009 Maier
(Continued)

FOREIGN PATENT DOCUMENTS

CN 104456249 B 9/2017
EP 2671756 A2 12/2013
(Continued)

OTHER PUBLICATIONS

International Preliminary Report on Patentability Chapter I dated Jan. 19, 2021 for PCT International Application No. PCT/EP2019/068551.
(Continued)

*Primary Examiner* — Grant S Withers
(74) *Attorney, Agent, or Firm* — Volpe Koenig

(57) ABSTRACT

A method for producing a flexible lighting strip comprising multitude of functional elements, which are light-emitting diodes, comprise light-emitting diodes, or are interposers with light-emitting diodes. The functional elements are in at least two groups, each comprising at least two functional elements in electrical series connection. The groups are in an electrical circuit having at least an anode and a cathode track as outer lines. The functional elements are in an electrical parallel connection to the anode and cathode tracks. The groups are in a longitudinal arrangement so a first group's last functional element is next to a second group's first functional element. Each of the outer lines has a wire line having substantially circular wires that are bent building zones capable of receiving compressive and tensile stress. The electrical circuit provides a third wire line having a substantially circular wire as a center line arranged between the outer lines.

5 Claims, 4 Drawing Sheets

(56) References Cited

U.S. PATENT DOCUMENTS

| | | |
|---|---|---|
| 2014/0268779 A1 | 9/2014 | Sorensen et al. |
| 2014/0313713 A1 | 10/2014 | Andrews |
| 2019/0051803 A1* | 2/2019 | Kums ............... H01L 23/49575 |

FOREIGN PATENT DOCUMENTS

| | | |
|---|---|---|
| EP | 3288350 A1 | 2/2018 |
| WO | 2017/157753 A1 | 9/2017 |
| WO | 2018/108676 A1 | 6/2018 |

OTHER PUBLICATIONS

International Search Report dated Sep. 4, 2019 for PCT International Application No. PCT/EP2019/068551.
Extended European Search Report dated Dec. 20, 2018 for European Patent Application No. 18184123.0.

* cited by examiner

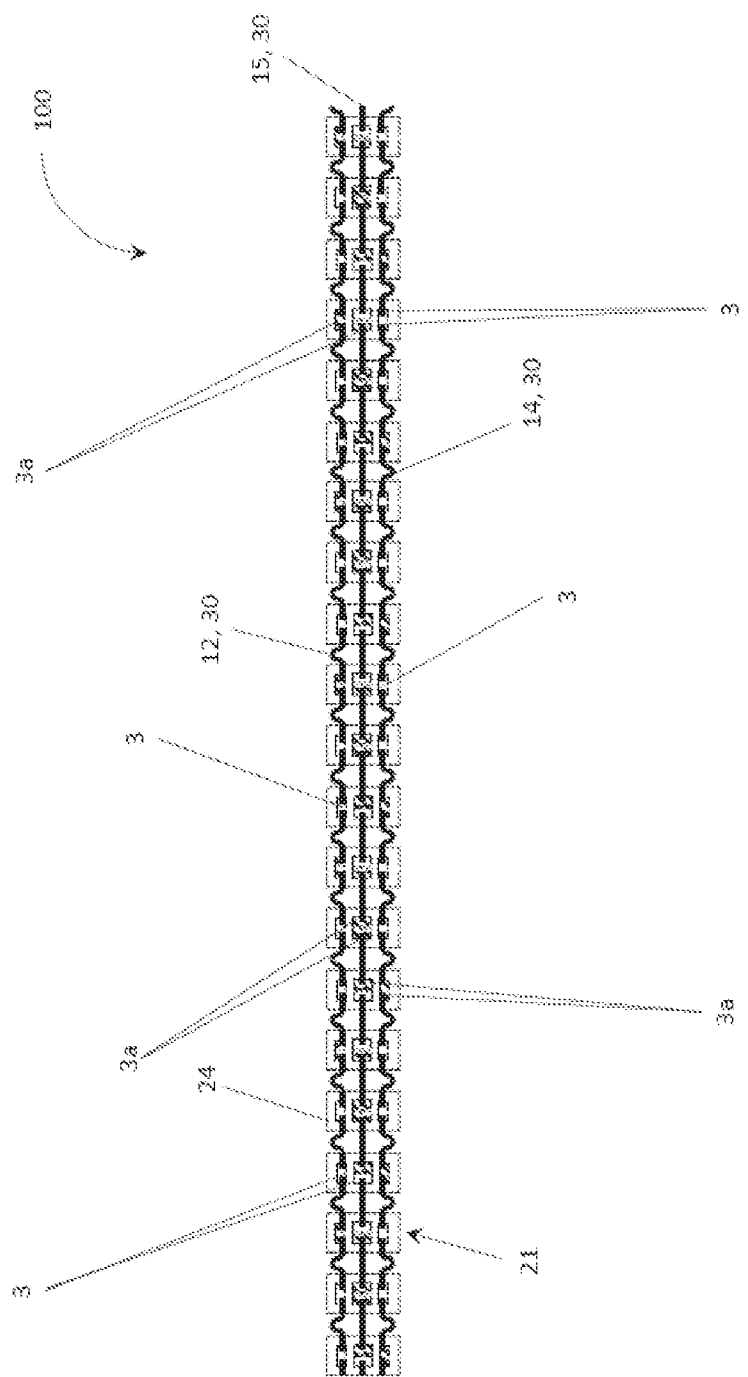

FLEXIBLE LIGHT-EMITTING DIODE LIGHTING STRIP WITH INTERPOSER

FIELD OF THE INVENTION

The invention relates to a method for producing a flexible lighting strip comprising a multitude of functional elements in a longitudinal arrangement. The invention further relates to a flexible lighting strip comprising a multitude of light-emitting diodes in a longitudinal arrangement produced with afore said method as well as to a light assembly comprising such a flexible lighting strip. The invention finally relates to a vehicle rear light or vehicle front light comprising such a vehicle light assembly.

BACKGROUND

Flexible light-emitting diode bands are used for an ever-increasing number of lighting applications. In many cases, an optical element is arranged in front of a light-emitting diode to alter the light emission, such as for instance a lens, a reflector and/or a collimator and/or light guide to obtain an emitted light beam of desired properties. Bendability or conformability of the light-emitting diode band allows fitting in a corresponding application as, for example, vehicle light assemblies which are integrated in curvy automobile body frames. Reliability of the flexible light-emitting diode band is a key feature especially for automotive applications.

US 2009/0296382 A1 discloses, for example, a flexible light-emitting diode band. The flexible light-emitting diode band has a basis for attaching the flexible light-emitting diode band and at least partially light-transmissive covering connectable to the basis, wherein in a state connected to each other the basis and the covering form an accommodation cavity for the flexible light-emitting diode band. The light-emitting diodes are placed on electrical conductors.

In practice it is difficult and complex to accurately position the light-emitting diodes on the electrical conductors connecting the single light-emitting diodes due to their length and stress.

SUMMARY

It is an object of the present invention to provide a method for producing a flexible lighting strip comprising a multitude of light-emitting diodes with improved reliability, whereby a simple and improved mechanically symmetric configuration shall be provided, whereby the method is improved in respect of accuracy of positioning of the light-emitting diodes on the electrical conductors connecting the single light-emitting diodes.

The invention is defined by the independent claims. The dependent claims define advantageous embodiments.

According to a first aspect a method for producing a flexible lighting strip comprising a multitude of functional elements is provided. The functional elements comprise light-emitting diodes. In one alternative, the functional elements may be light-emitting diodes itself. In another alternative, the functional elements may be interposers with light-emitting diodes mounted thereon. The functional elements are arranged in at least two groups. Each group comprises at least two functional elements arranged in an electrical series connection. The at least two groups are arranged in an electrical circuit having at least an anode track and a cathode track as outer lines, wherein the at least two functional elements are arranged in an electrical parallel connection to the anode track and the cathode track. The at least two groups are arranged in a longitudinal arrangement such that a last functional element of a first group is arranged next to a first functional element of a second group. Each of the outer lines consists of a wire line having wire segments having substantially circular wires, whereby at least one of the wire segments of the outer lines is bent building zones that are capable to receive compressive and/or tensile stress. The electrical circuit provides a third wire line having a substantially circular wire as a center line arranged between the outer lines. The method comprises the steps of soldering a first functional element to a first wire segment and connecting of the at least one wire segment to a second functional element.

Preferably this builds up light source groups. It is especially advantageous to make all wire segments within one group to solder connections within the one group in one step, preferably by placing the components in an appropriate holder.

According to a preferred embodiment of the invention the connection of the at least one wire segment to the second functional element is done via at least one second wire element. If light source groups are built up, they are preferably connected via the at least one second wire element.

According to an advantageous embodiment of the invention the at least one wire segment is connected to the second wire segment by laser welding.

Other methods to connect the at least one wire segment to the second wire segment comprise induction welding, resistance welding or any other welding process.

According to a preferred embodiment of the invention the functional element is a light-emitting diode.

According to an advantageous embodiment of the invention the functional element is an interposer, whereon a light-emitting diode is mounted.

According to a preferred embodiment of the invention at least one of the wire segments is made from Cu or a Cu containing alloy, advantageously CuFe2P or CuNiSi.

According to an advantageous embodiment of the invention the functional element is soldered to any of the wire lines employing a lead-free solder.

According to a preferred embodiment of the invention all solder connections connecting the functional elements within a group to the wire lines are made in one soldering step. Preferably all solder connections connecting all functional elements to the wire lines are made in one soldering step.

According to a preferred embodiment of the invention the functional element contacts all three wire lines.

According to a preferred embodiment of the invention the functional elements are grouped, preferably in the one soldering step and especially preferred by laser welding.

According to a further aspect of the invention a lighting strip is provided, wherein the lighting strip is produced according to methods or method steps described in this application text.

According to an advantageous embodiment of the invention the interposer of the functional element is made of a ceramic material.

According to a preferred embodiment of the invention interposer of the functional element is a printed circuit board (PCB) made of Cu-IMS, Al-IMS, CEM3, FR4, FR5 or any other common PCB material.

According to a further aspect of the invention a vehicle light assembly comprises the advantageously flexible lighting strip described in this application text.

According to an advantageous embodiment of the invention the vehicle light assembly comprises an electrical interface, wherein the electrical interface is arranged to couple the lighting strip to an external power supply.

According to an additional aspect of the invention a vehicle rear light or vehicle front light is provided, wherein the vehicle rear light or the vehicle front light comprises the vehicle light assembly.

Using the circular wire form, forces imposed on the flexible lighting strip during thermomechanical cycle stress testing −40 C/125 C 5 sec/30 min drain/dwell duration as used for automotive applications do not affect the lighting strip. The circular wire form is capable to withstand and absorb stresses better as a square lead frame line and allows to pass the stress tests required for automotive applications.

Since the outer lines have segments with bended wires, these zones can receive compressive and tensile stress, respectively.

The method proposes not to use one long shaped wire as outer current carrying lines, but to build up the functionality by small shaped wire segments that connect for instance only two functional elements. The functional elements of one string may also be soldered to a longer wire piece where the bend segments induced in the wire correspond to the numbers of functional elements attached to it. The bend segments then are positioned between the functional elements after reflow soldering. The segments comprising the functional elements in series though generated can be connected, for instance by laser welding. In case the wire to mount the functional elements on are long ones with bended zones in it, it is hard to position the functional elements on them by reflow soldering due to the length of the wire and the stress induced during bending the wire. By building up the flexible lighting strip out of single segments, whereby the functional elements are soldered to shorter straight segments, the functional elements can be positioned with high accuracy. The bend zones of the outer wires are capable to absorb compressive and/or tensile stress by giving way. To achieve this effect nevertheless, the soldering of the functional elements and the bending of the wire is decoupled.

In the method, a second wire segment may be bent after soldering the functional elements to a first wire segment and before connecting of the first wire segment to the second wire segment.

The functional elements may be light-emitting diodes itself. In another alternative, the functional elements may be interposers with light-emitting diodes mounted thereon. Soldering the light-emitting diode on an interposer, to which the wires are soldered in a second step, leads to a simpler and mechanically more symmetric configuration of the flexible lighting strip. The light-emitting diodes may be connected more easily using an interposer. The light-emitting diode may be provided as an SMD component. The wires of the first wire segments may consist of material comprising for instance Cu, CuFe2P or CuNiSi, Also the wires of the second wire segments may consist of material comprising for instance Cu, CuFe2P or CuNiSi.

It is imaginable to use different methods for jointing the components, such as for instance welding.

The functional element may be soldered to any of the wire lines, preferably with a lead-free solder as for example SAC 305.

According to a further aspect, in a flexible lighting strip produced according to the method as described above, the functional element contacts all three wire lines. Since the functional element contacts all three wire lines, the flexible lighting strip is mechanically stabilized.

In the flexible lighting strip, three functional elements may be connected in series between the outer lines. A first functional element may connect one outer line to a first inner segment, the first inner segment may be connected via a second functional element to a second inner segment, and the second inner segment may connect via a third functional element to the second outer line. The outer lines may be continued; however, the inner line may be segmented. Moreover, the center wire of the inner line may be composed of straight segments.

In case the functional element comprises an interposer with a light-emitting diode mounted on it, the interposer may have two electrical coupling pads on a first side for connection to the light-emitting diode. Thereby, anode and cathode pad may differ to correctly orient the light-emitting diodes.

Moreover, the interposer may have four coupling pads on a second side for connection to the wires.

The two coupling pads on the first side of the interposer may be connected to two of the coupling pads of the second side of the interposer via vias.

Only the outer lines may have interposers. In another embodiment, all wire lines have interposers. To have two light-emitting diodes in series, the middle interposer may be omitted. To have four or more light-emitting diodes connected in series, the middle interposer may be duplicated according to the number of light-emitting diodes desired to be in the string.

The third wire line may be executed as straight wire line. The straight wire line may be interrupted. Not all straight wires may carry current.

The interposer may be made of FR4 or out of a ceramic material, such as for instance Al2O4 or MN.

The light-emitting diode and the wire may be soldered to the interposer. The sequence of soldering—wire or light-emitting diode attached to the interposer first can be chosen. One solder point may be double re-flown.

The light-emitting diode may be SAC305 soldered to the interposer.

The light-emitting diode may be AuSn attached to the interposer.

Moreover, additional electrical components may be mounted on the interposer. Such additional electrical components are TVS diodes, resistors to adjust the light output of the light-emitting diodes according to their bin code and future performance or logic components that can switch on and of all or individual or single light-emitting diodes for instance in the string or in the strings.

According to a further aspect a vehicle light assembly is provided. The vehicle light assembly comprises the flexible lighting strip according to any embodiment described above. The vehicle light assembly comprises an electrical interface. The electrical interface is arranged to couple the vehicle light assembly to an external power supply.

A vehicle rear light or vehicle front light may comprise the vehicle light assembly in accordance with any embodiment described above.

The vehicle light assembly may, for example, be used in daytime running light (DRL), tail light, stop light or turn light.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

Figure 1:
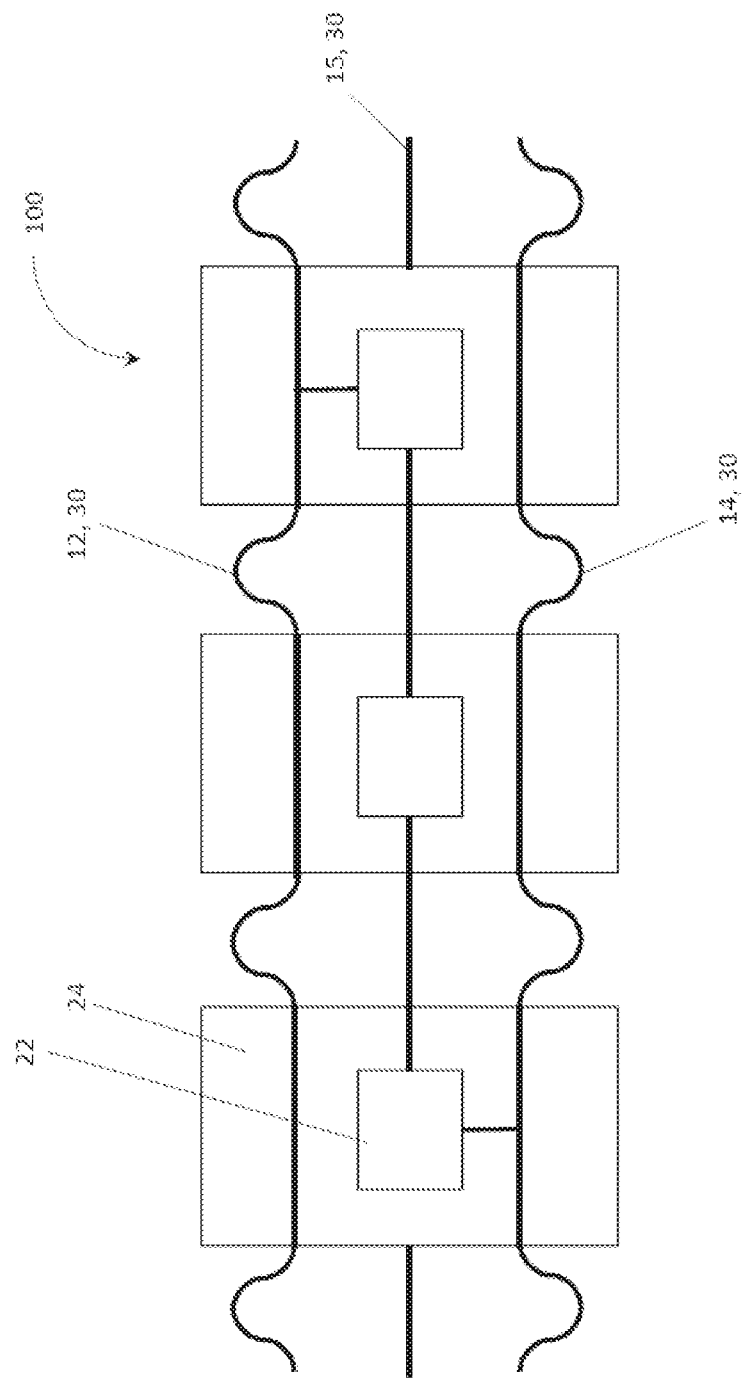
Figure 2:
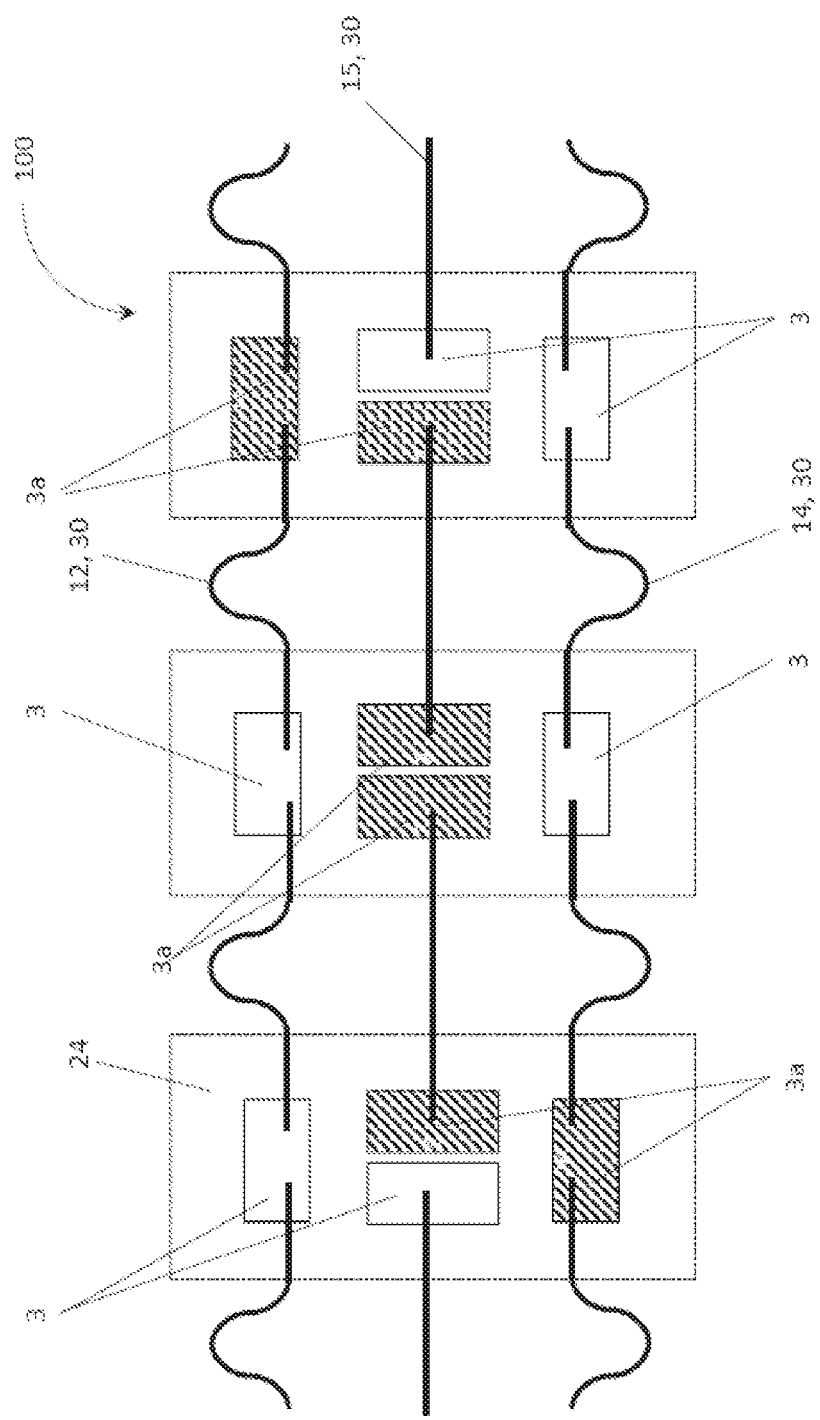
Figure 3:
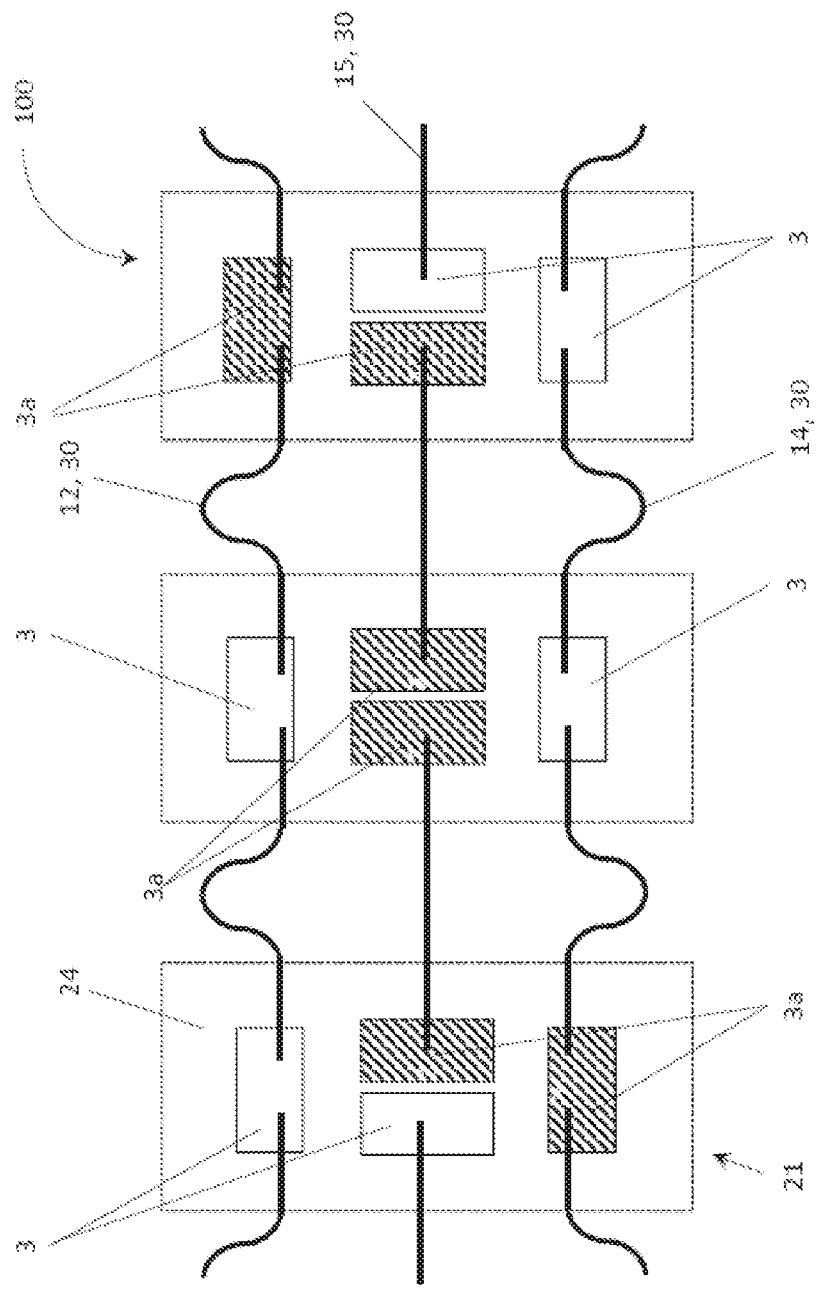

FIG. 1 shows a top view of three SMD light-emitting diodes on an interposer with light-emitting diodes mounted FIG. 2 shows a top view of a segment of a flexible lighting strip according to the invention, cut at wire pad level FIG. 3 shows a top view of a segment of a flexible lighting strip according to the invention as an alternative, cut at wire pad level FIG. 4 shows the build-up of a longer circuit built up according to the invention

DETAIL DESCRIPTION OF EMBODIMENTS

Various embodiments of the invention will now be described by means of the Figures.

FIG. 1 shows a top view of three SMD light-emitting diodes 22 as functional elements 21 on interposers 24 as section of a flexible light-emitting diode band with multitude of light-emitting diodes in a longitudinal arrangement. The electrical connection of the light-emitting diodes 22 is included. In the flexible lighting strip 100, three light-emitting diodes 22 are connected in series between the outer lines 12, 14. A first light-emitting diode 22 is connected to the cathode track 14 to a first inner segment, the first inner segment is connected via a second light-emitting diode 22 to a second inner segment, and the second inner segment is connected via a third light-emitting diode to the anode track 12. The outer lines 12, 14 are continued, however the inner line with is the third wire line 15 is segmented. Moreover, the wire 30 of the third wire line 15 is composed of straight segments. The wires 30 of the anode track 12 and cathode track 14 are made as one piece.

FIG. 2 shows a top view of three SMD light-emitting diodes 22 on interposers 24 according to the invention, cut at wire pad level. The hatched coupling pads 3a connect with the top surface of the interposer 24 via vias (not shown). The outer lines 12, 14 have segments with bended wires 30. These zones can receive compressive and tensile stress, respectively.

The functionality is built by small shaped pieces of wire 30 that connect only two functional elements 21, whereby the functional elements 21 in the embodiment as drawn are interposers 24 with light-emitting diodes 22 (not shown) mounted thereon. The bend segments induced in the wire 30 correspond to the numbers of functional elements 21 attached to it. The bend segments are positioned between the functional elements 21 after reflow soldering.

FIG. 3 shows a top view of three SMD light-emitting diodes 22 on interposers 24 according to another embodiment of the invention, cut at wire pad level. Again the hatched coupling pads 3a connect with the top surface of the interposer 24 via vias (not shown). The outer lines 12, 14 have segments with bended wires 30. To easily build up a string of parallel LED strings part-strings as shown in the figure may be produced. Every part-string is a part of the string shown in FIG. 2 consisting of three functional elements 21, whereby these three functional elements 21 are connected to each other via a segmented anode track 12, a segmented cathode track 14 and a segmented third wire line 15, whereby the anode track 12 and the cathode track 14 comprise zones of bended wires 30. The ends of the part-string comprise ends of the anode track 12, the cathode track 14 and the third wire line 15, whereby the ends of the anode track 12 and the cathode track 14 comprise bended zones of the respective wires 30. These bended zones end in the middle of the bend, i.e. form a half-bend, whereby the parts can be connected, for instance by laser welding of every half-bend of a first part-string with the respective half-bend of a second part-string as well as of every cut third wire line 15 of a first part-string with the respective cut third wire line 15 of a second part-string.

FIG. 4 shows the build-up of a longer circuit built up according to the invention. The circuit is built up from single part-strings consisting of three functional elements 21 each, whereby these three functional elements 21 are connected to each other via a segmented anode track 12, a segmented cathode track 14 and a segmented third wire line 15, whereby the anode track 12 and the cathode track 14 comprise zones of bended wires 30. The ends of the part-strings are connected by laser welding of every half-bend of the outer lines 12, 14 of a first part-string with the respective half-bend of the outer lines 12,14 of a second part-string as well as of every cut third wire line 15 of a first part-string with the respective cut third wire line 15 of a second part-string.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

REFERENCE SIGNS 3 coupling pad
3a coupling pad, connecting
12 anode track, outer line
14 cathode track, outer line
15 third wire line
21 functional element
22 light-emitting diode (LED)
24 interposer
30 wire
100 flexible lighting strip

What is claimed is:

1. A flexible lighting strip, comprising:
a multitude of functional elements;
a multitude of light-emitting diodes arranged on the functional elements;
the multitude of functional elements arranged in at least two groups, each group comprising at least two functional elements;
the at least two groups arranged in a longitudinal arrangement such that a last functional element of a first group of the at least two groups is arranged next to a first functional element of a second group of the at least two groups;

a plurality of wire segments comprising bent and straight wire segments; and the functional elements joined to the wire segments,
wherein the wire segments comprise substantially circular wires,
wherein the functional elements of each of the at least two groups are arranged by the wire segments in an electrical series connection, with at least one straight wire between two of the functional elements,
wherein the at least two groups of functional elements are arranged by the wire segments in an electrical parallel connection forming an electric circuit of an anode track and a cathode track,
wherein the anode track and the cathode track are arranged as outer lines and comprise at least one bent wire segment building a zone that is capable of receiving at least one of a compressive stress and a tensile stress,
wherein the at least one straight wire line of the electrical series connection is arranged between the outer lines, and
wherein at least one of the functional elements of each of the at least two groups contacts all of the anode track, the cathode track and the at least one straight wire.

2. The flexible lighting strip according to claim 1, further comprising a plurality of interposers, each of the at least two groups of functional elements being disposed on a respective one of the plurality of interposers, wherein the plurality of interposers are made of at least one of FR4 and a ceramic material.

3. The flexible lighting strip according to claim 1, further comprising a plurality of interposers, each of the at least two groups of function elements being disposed on a respective one of the plurality of interposers, wherein the plurality of interposers are made of a printed circuit board.

4. A vehicle light assembly comprising;
a flexible lighting strip, comprising:
a multitude of functional elements;
a multitude of light-emitting diodes arranged on the functional elements;
the multitude of functional elements arranged in at least two groups, each group comprising at least two functional elements;
the at least two groups arranged in a longitudinal arrangement such that a last functional element of a first group of the at least two groups is arranged next to a first functional element of a second group of the at least two groups;
a plurality of wire segments comprising bent and straight wire segments; and
the functional elements joined to the wire segments,
wherein the wire segments comprise substantially circular wires,
wherein the functional elements of each of the at least two groups are arranged by the wire segments in an electrical series connection, with at least one straight wire between two of the functional elements,
wherein the at least two groups of functional elements are arranged by the wire segments in an electrical parallel connection forming an electric circuit of an anode track and a cathode track,
wherein the anode track and the cathode track are arranged as outer lines and comprise at least one bent wire segment building a zone that is capable of receiving at least one of a compressive stress and a tensile stress,
wherein the at least one straight wire line of the electrical series connection is arranged between the outer lines, and
wherein the vehicle light assembly comprises an electrical interface, wherein the electrical interface is arranged to couple the vehicle light assembly to an external power supply.

5. The vehicle light assembly according to claim 4, wherein the vehicle light assembly is used in at least one of a vehicle rear light and vehicle front light.

\* \* \* \* \*